United States Patent
Kim

(10) Patent No.: US 7,355,446 B2
(45) Date of Patent: Apr. 8, 2008

(54) VOLTAGE CONVERSION CIRCUIT WITH STABLE TRANSITION DELAY CHARACTERISTIC

(75) Inventor: Min-Su Kim, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 77 days.

(21) Appl. No.: 11/429,175

(22) Filed: May 5, 2006

(65) Prior Publication Data

US 2006/0261851 A1    Nov. 23, 2006

(30) Foreign Application Priority Data

May 20, 2005 (KR) ............... 10-2005-0042583
Aug. 19, 2005 (KR) ............... 10-2005-0076246

(51) Int. Cl.
*H03K 19/0175* (2006.01)
(52) U.S. Cl. .............. 326/81; 326/83; 326/68; 327/333
(58) Field of Classification Search ........... 326/81, 326/29, 80, 62, 63; 327/170, 333
See application file for complete search history.

(56) References Cited

U.S. PATENT DOCUMENTS

| | | | |
|---|---|---|---|
| 6,753,697 B2* | 6/2004 | Nakase | 326/68 |
| 6,850,090 B2* | 2/2005 | Aoki | 326/68 |
| 7,091,748 B2* | 8/2006 | Wada | 326/81 |
| 2004/0085114 A1 | 5/2004 | Hong et al. | |
| 2005/0285658 A1* | 12/2005 | Schulmeyer et al. | 327/333 |

FOREIGN PATENT DOCUMENTS

| | | |
|---|---|---|
| JP | 2002-344301 | 11/2002 |
| JP | 2004-153689 | 5/2004 |
| KR | 1020040039581 | 5/2004 |

* cited by examiner

*Primary Examiner*—Rexford Barnie
*Assistant Examiner*—Crystal L. Hammond
(74) *Attorney, Agent, or Firm*—F. Chau & Assoc., LLC

(57) ABSTRACT

A voltage conversion circuit changes an input signal of a first voltage into an output signal of a second voltage. The circuit includes an input terminal receiving an input signal, an output terminal generating an output signal, and first and second level-shifting units connected in parallel between the input and output terminals. The first and second level-shifting units have different transition delay characteristics, enabling rising and falling transition delays to be variable in the same ratio when the first and second voltages are changed.

27 Claims, 14 Drawing Sheets

(ΔTD: Transition delay variation)

(ΔTD:Transition delay variation)

VOLTAGE CONVERSION CIRCUIT WITH STABLE TRANSITION DELAY CHARACTERISTIC

CROSS-REFERENCE TO RELATED APPLICATIONS

This U.S. non-provisional patent application claims priority under 35 U.S.C. § 119 of Korean Patent Application 2005-42583 filed on May 20, 2005 and 2005-76246 filed on Aug. 19, 2005, the entire content of which is hereby incorporated by reference.

BACKGROUND

The disclosure herein is directed to integrated circuits, and more particularly, voltage conversion circuits in the form of integrated circuits.

With the expansion of mobile product markets, there is additional need for power economization in the mobile devices because they must operate optimally for extended periods of time and with limited battery capacity. As a result, many techniques for power economization in mobile devices have been proposed. One proposal is to supply different voltages to functional blocks of the mobile apparatuses. In this configuration, low-functional blocks are supplied with lower voltages, and high-functional blocks are supplied with higher voltages. However, as the different voltages are applied to the functional blocks, leakage currents increase. It therefore becomes difficult to ensure normal operational performance in interfacing with the functional blocks due to the resulting voltage differences between the external and internal voltages.

FIG. 1 shows a conventional voltage conversion circuit (or level shifting circuit) for interfacing with the functional blocks at various voltage levels.

Another technique implemented for reducing power consumption in mobile apparatuses is dynamic voltage-scaling (DVS). DVS operates by varying and adjusting voltages, which are applied to the functional blocks, in accordance with operational conditions. For instance, high voltages are used in normal states of operation, and low voltages are used in standby states. However, using DVS produces an operating voltage for a functional block which will be higher or lower than operating voltages in peripheral blocks.

In general, the transition delays arising from operations of signal transmission are determined by the gate-source voltages of the transistors in the signal transmission circuit. For example, as illustrated in FIG. 2A, when an input signal IN1 of an inverter goes up to a first voltage VDD1 of high level from a ground voltage of low level, the NMOS transistor M12 is turned on. During this, an output signal OUT1 of the inverter goes down to a low level of the ground voltage from a high level of the first voltage VDD1, where the high-to-low transition of the output signal OUT1 is determined by a gate-source voltage of the NMOS transistor M12. Also, as illustrated in FIG. 2B, when an input signal IN2 of an inverter rises up to a second voltage VDD2 of high level from the ground voltage of low level, the NMOS transistor M14 is turned on. During this, an output signal OUT2 of the inverter falls down to a low level of the ground voltage from a high level of the first voltage VDD1, where the high-to-low transition of the output signal OUT2 is determined by a gate-source voltage of the NMOS transistor M14.

Assuming that the first voltage VDD1 is higher than the second voltage VDD2, the high-to-low transition of the output signal OUT1 occurs before that of the output signal OUT2 because the gate-source voltage of the NMOS transistor M12 is higher than that of the NMOS transistor M14.

Hereinafter, the high-to-low transition of the output signal OUT1 will be referred to as 'fast transition', and the high-to-low transition of the output signal OUT2 will be referred to as 'slow transition', under the condition that the first voltage VDD1 is higher than the second voltage VDD2. As is known in the art, a signal delay time of fast transition is shorter than that of slow transition.

On the other hand, as illustrated in FIG. 2C, when an input signal IN3 of an inverter goes down to the ground voltage of low level from the first voltage VDD1 of high level, the PMOS transistor M15 is turned on. During this, an output signal OUT3 of the inverter goes up to a high level of the first voltage VDD1 from a low level of the ground voltage, where the low-to-high transition of the output signal OUT1 is determined by a gate-source voltage of the PMOS transistor M15. Also, as illustrated in FIG. 2D, when an input signal IN4 of an inverter goes to the ground voltage of low level from the second voltage VDD2 of high level, the PMOS transistor M17 is turned on. During this, an output signal OUT4 of the inverter goes up to a high level of the first voltage VDD1 from a low level of the ground voltage, where the low-to-high transition of the output signal OUT4 is determined by a gate-source voltage of the PMOS transistor M17.

Here, according to the aforementioned assumption, i.e., if VDD1>VDD2, the low-to-high transition of the output signal OUT3, as well as the low-to-high transition of the output signal OUT4, are regarded as operating in the fast transition because the gate-source voltages of the PMOS transistors M15 and M17 rise up to VDD1 at maximum.

As can be understood from the aforementioned, when the first voltage VDD1 is lower than the second voltage VDD2, the output signals, OUT1, OUT3, and OUT4, are regarded as operating in the slow transition because the maximum gate-source voltages of the transistors are VDD1. However, the output signal OUT2 is regarded as operating in the fast transition because the maximum gate-source voltage of the transistor is VDD2.

As mentioned above, using DVS produces operating voltages for the functional blocks which are higher or lower than other voltages in peripheral blocks. This produces generated distortions of transfer signals (i.e., clock signals) and duty ratio. Now, variations in duty ratio related to the characteristics of transition delays will be described.

Referring to FIG. 1, if VDD1 is higher than the second voltage VDD2, when a signal falls from high to low and VDD1 is applied at an input terminal T1, a PMOS transistor M1, an NMOS transistor M5, a PMOS transistor M4, and an NMOS transistor M10 are turned on. During this, the transistors, M1, M5, M4, and M10, are operating in the conditions of fast, fast, slow, and slow (FFSS) transitions, respectively. Otherwise, when a signal rises from low to high and VDD1 is applied to an input terminal T1, a NMOS transistor M2, a PMOS transistor M7, an NMOS transistor M6, and a PMOS transistor M9 are turned on. During this, the transistors, M2, M7, M6, and M9, are operating in the conditions of fast, fast, fast, and slow (FFFS) transitions, respectively.

If the first voltage VDD1 is lower than the second voltage VDD2, when a signal falls from high to low and VDD1 is applied to an input terminal T1, the PMOS transistor M1, the NMOS transistor M5, the PMOS transistor M4, and the NMOS transistor M10 are turned on. During this, the transistors, M1, M5, M4, and M10, are operating in the conditions of slow, slow, fast, and fast (SSFF) transitions, respectively. Otherwise, when a signal rises from low to high and VDD1 is applied to an input terminal T1, the NMOS transistor M2, the PMOS transistor M7, the NMOS transistor M6, and the PMOS transistor M9 are turned on. During this, the transistors, M2, M7, M6, and M9, are operating in the conditions of slow, slow, slow, and fast (SSSF) transitions, respectively.

Hereinafter, a fast transition is represented by a symbol 'F' while a slow transition is represented by a 'S', with the variation patterns of transition being summarized in the following Table 1.

TABLE 1

| IN | VDD1 > VDD2 | VDD1 < VDD2 |
|---|---|---|
| HIGH→LOW (VDD1→GND) | FFSS | SSFF |
| LOW→HIGH (GND→VDD1) | FFFS | SSSF |

As can be seen from Table 1, the patterns of transition delay are changed by variations of the first and second voltages VDD1 and VDD2. While the down-transition delay pattern changes to 'SSFF' from 'FFSS', there is no variation in the down-transition delay characteristic as a whole. However, the up-transition delay pattern changes to 'SSSF' from 'FFFS', resulting in variation by 2F2S. This result of the up-transition delay means that there is variation of a signal (e.g., a clock signal) transferred through the level shifting circuit LS. For example, assuming that the first voltage VDD1 is higher than the second voltage VDD2 (VDD1>VDD2) and the duty ratio of the clock signal OUT_CLK therein is 50:50; the duty ratio of the clock signal OUT_CLK deviates by 50% from the condition of VDD1<VDD2, as shown in FIG. 3. This difference between duty ratios occurs as the down-transition delay is different from the up-transition delay in the pattern of variation when the first and second voltages VDD1 and VDD2 are changing.

As is well known in the art, the distortion of the clock duty ratio causes a clock skew effect in the circuit. The clock skew causes reduction of setup and hold margins. In summary, the clock skew generation results in a decrease of operation speed and decreased performance in the level shifting circuit or voltage conversion circuit.

SUMMARY OF THE INVENTION

An aspect of the invention is a voltage conversion circuit to generate an output signal of a second voltage from an input signal of a first voltage. The voltage conversion circuit is comprised of: an input terminal receiving the input signal; an output terminal generating the output signal; and first and second level-shifting units connected between the input and output terminals in parallel. The first and second level-shifting units are complementary to each other in transition delay characteristic so as to make up and down-transition delays variable in the same rate when the first and second voltages are changing.

In a preferred embodiment, each of the first and second level-shifting units has at least three signal transmission stages.

In a preferred embodiment, when the first voltage is higher than the second voltage while the input signal goes to high level from low level, the signal transmission stages of the first level-shifting unit operate in a transmission delay characteristic of 'FFF' and the signal transmission stages of the second level-shifting unit operate in a transmission delay characteristic of 'FSS'. Here, the 'F' represents a fast transition delay of a MOS transistor along a gate-source voltage and the 'S' represents a slow transition delay of a MOS transistor along a gate-source voltage.

In a preferred embodiment, when the first voltage is higher than the second voltage while the input signal goes to low level from high level, the signal transmission stages of the first level-shifting unit operate in a transmission delay characteristic of 'FFS' and the signal transmission stages of the second level-shifting unit operate in a transmission delay characteristic of 'FFS'.

In a preferred embodiment, when the first voltage is lower than the second voltage while the input signal goes to high level from low level, the signal transmission stages of the first level-shifting unit operate in a transmission delay characteristic of 'SSS' and the signal transmission stages of the second level-shifting unit operate in a transmission delay characteristic of 'SFF'.

In a preferred embodiment, when the first voltage is lower than the second voltage while the input signal goes to low level from high level, the signal transmission stages of the first level-shifting unit operate in a transmission delay characteristic of 'SSF' and the signal transmission stages of the second level-shifting unit operate in a transmission delay characteristic of 'SSF'.

In a preferred embodiment, the first level-shifting unit comprises: a first inverter connected to the input terminal; a second inverter connected to the input terminal; and a first differential amplifier driving the output terminal with one of the second voltage and a ground voltage in response to outputs of the first and second inverters. The first and second inverters are supplied with the first voltage, and the first differential amplifier is supplied with the second voltage.

In a preferred embodiment, the first level-shifting unit further comprises an isolation circuit to electrically disconnect the output terminal from a first cross-coupling node of the first differential amplifier.

In a preferred embodiment, the isolation circuit comprises: a PMOS transistor connected between the second voltage and the output terminal, having a gate coupled to a second cross-coupling node of the first differential amplifier; and a NMOS transistor connected between the output terminal and the ground voltage, having a gate coupled to the output of the second differential amplifier.

In a preferred embodiment, the second level-shifting unit comprises: a third inverter connected to the input terminal; a second differential amplifier generating a signal with one of the second voltage and a ground voltage in response to the input signal and an output of the third inverter; and a fourth inverter connected between an output of the second differential amplifier and the output terminal. The third inverter is supplied with the first voltage, and the second differential amplifier and the fourth inverter are supplied with the second voltage.

In a preferred embodiment, the second level-shifting unit comprises: a second differential amplifier generating a signal with one of the second voltage and a ground voltage in response to the input signal and an output of the first inverter; and a third inverter connected between an output of the second differential amplifier and the output terminal. The second differential amplifier and the third inverter are supplied with the second voltage.

In a preferred embodiment, the second level-shifting unit comprises: a first PMOS transistor connected between the second voltage and an internal node, having a gate coupled to a first cross-coupling node of the first differential amplifier; a first NMOS transistor connected between the internal node and the ground voltage, having a gate coupled to the input terminal; a second PMOS transistor connected between the second voltage and the first cross-coupling node, having a gate coupled to the internal node; and a second NMOS transistor connected between the output terminal and the ground voltage, having a gate coupled to a second cross-coupling node of the first differential amplifier.

In a preferred embodiment, the first cross-coupling node of the first differential amplifier is connected to the output terminal.

In a preferred embodiment, the voltage conversion circuit further comprises an inverter connected to the output terminal, being supplied with the second voltage.

In an embodiment, each of the first and second level-shifting units has four signal transmission stages. First, when the first voltage is higher than the second voltage while the input signal goes to high level from low level, the signal transmission stages of the first level-shifting unit operate in a transmission delay characteristic of 'FFFS' and the signal transmission stages of the second level-shifting unit operate in a transmission delay characteristic of 'FSSS', where the 'F' represents a fast transition delay of a MOS transistor along a gate-source voltage and the 'S' represents a slow transition delay of a MOS transistor along a gate-source voltage. Secondly, when the first voltage is higher than the second voltage while the input signal goes to low level from high level, the signal transmission stages of the first level-shifting unit operate in a transmission delay characteristic of 'FFSS' and the signal transmission stages of the second level-shifting unit operate in a transmission delay characteristic of 'FFSS'.

Thirdly, when the first voltage is lower than the second voltage while the input signal goes to high level from low level, the signal transmission stages of the first level-shifting unit operate in a transmission delay characteristic of 'SSSF' and the signal transmission stages of the second level-shifting unit operate in a transmission delay characteristic of 'SFFF'. Finally, when the first voltage is lower than the second voltage while the input signal goes to low level from high level, the signal transmission stages of the first level-shifting unit operate in a transmission delay characteristic of 'SSFF' and the signal transmission stages of the second level-shifting unit operate in a transmission delay characteristic of 'SSFF'.

In an embodiment, the first level-shifting unit comprises: a first inverter connected to the input terminal; a second inverter connected to the input terminal; a first differential amplifier having first and second cross-coupling nodes and operating in response to outputs of the first and second inverters; and a first isolation circuit to electrically disconnect the output terminal from the first cross-coupling node and drive the output terminal with one of the second voltage and a ground voltage in response to outputs from the second cross-coupling node and the second inverter. The first and second inverters are supplied with the first voltage, and the first differential amplifier and isolation circuit are supplied with the second voltage. The isolation circuit comprises: a PMOS transistor connected between the second voltage and the output terminal, having a gate coupled to a second cross-coupling node of the first differential amplifier; and an NMOS transistor connected between the output terminal and the ground voltage, having a gate coupled to the output of the second differential amplifier.

In an embodiment, the second level-shifting unit comprises: a third inverter connected to the input terminal; a second differential amplifier having third and fourth cross-coupling nodes and generating a signal with one of the second voltage and the ground voltage in response to the input signal and an output of the third inverter; a second isolation circuit generating a signal with one of the second voltage and the ground voltage in response to outputs from the fourth cross-coupling node and the third inverter; and a fourth inverter connected between an output of the second isolation circuit and the output terminal, in which the third inverter is supplied with the first voltage, and the second differential amplifier, the second isolation circuit, and the fourth inverter are supplied with the second voltage. The second isolation circuit comprises: a PMOS transistor connected between the second voltage and an input of the fourth inverter, having a gate coupled to the fourth cross-coupling node of the second differential amplifier; and an NMOS transistor connected between the input of the fourth inverter and the ground voltage, having a gate coupled to the output of the third inverter.

In an embodiment, the second level-shifting unit comprises: a second differential amplifier having third and fourth cross-coupling nodes and generating a signal with one of the second voltage and the ground voltage in response to the output of the first inverter and the input signal; a second isolation circuit generating a signal with one of the second voltage and the ground voltage in response to outputs from the fourth cross-coupling node and the first inverter; and a fourth inverter connected between an output of the second isolation circuit and the output terminal, in which the second differential amplifier, the second isolation circuit, and the fourth inverter are supplied with the second voltage. The second isolation circuit comprises: a PMOS transistor connected between the second voltage and an input of the fourth inverter, having a gate coupled to the fourth cross-coupling node of the second differential amplifier; and an NMOS transistor connected between the input of the fourth inverter and the ground voltage, having a gate coupled to the output of the first inverter.

BRIEF DESCRIPTION OF THE DRAWINGS

Embodiments of the present invention will be described with reference to the following figures, wherein like reference numerals refer to like parts throughout the various figures unless otherwise specified. In the figures.

DETAILED DESCRIPTION OF PREFERRED EMBODIMENTS

Preferred embodiments of the invention will be described below in more detail with reference to the accompanying drawings. The invention may, however, be embodied in different forms and should not be constructed as limited to the embodiments set forth herein.

Figure 1:
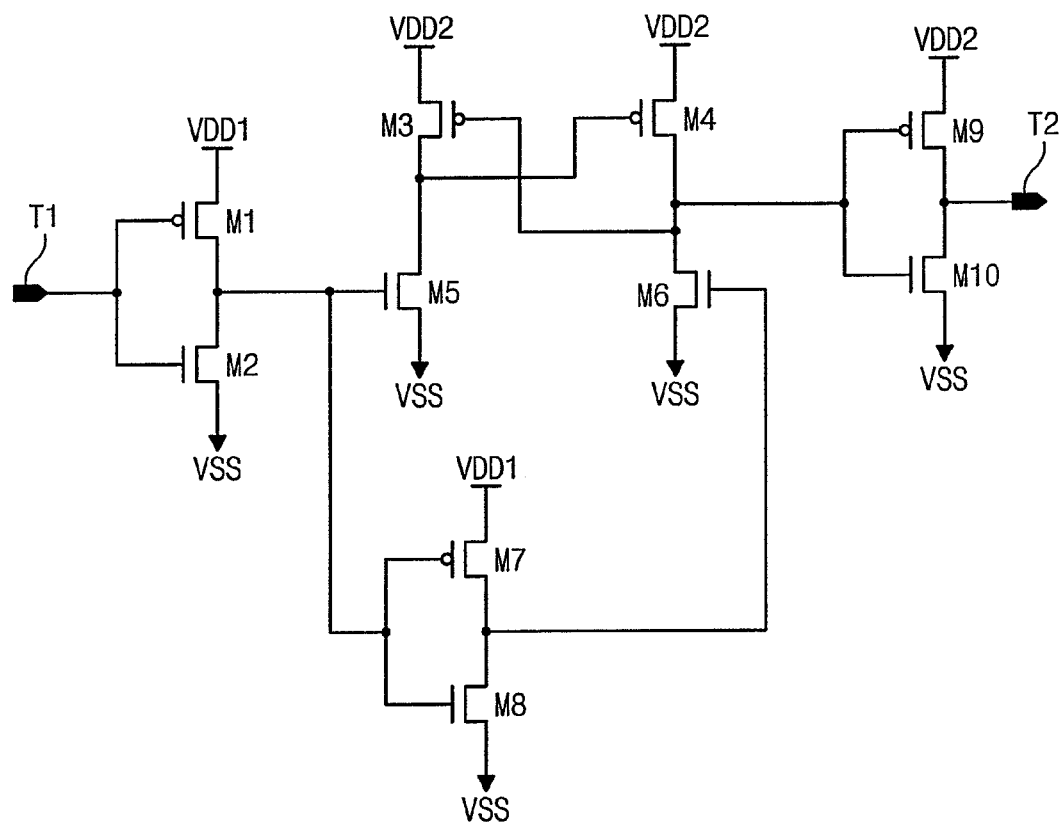
FIG. 1 is a circuit diagram of a conventional voltage conversion circuit.
Figure 2A:
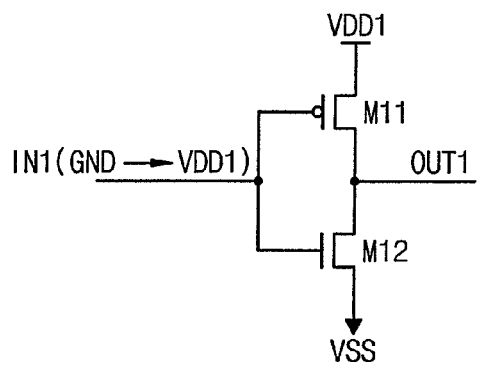
FIGS. 2A through 2D are equivalent circuit diagrams illustrating transition delay characteristics according to variations of gate-source voltages in MOS transistors.
Figure 2B:
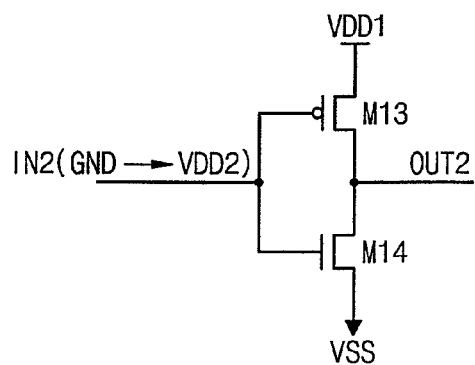
Figure 2C:
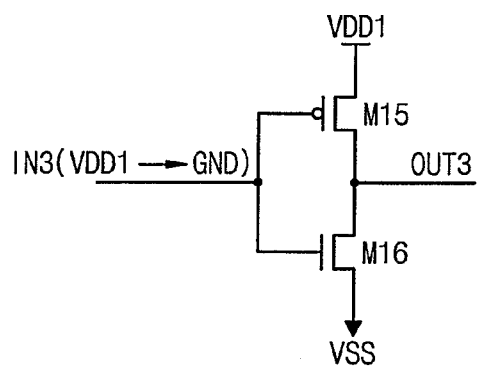
Figure 2D:
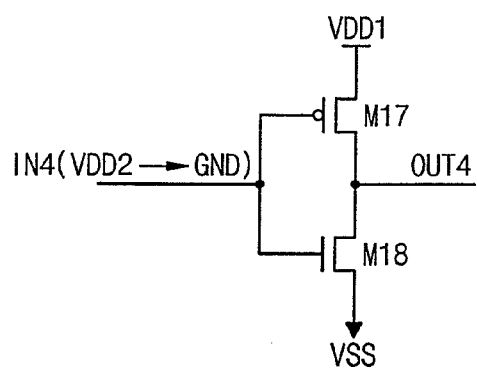
Figure 3:
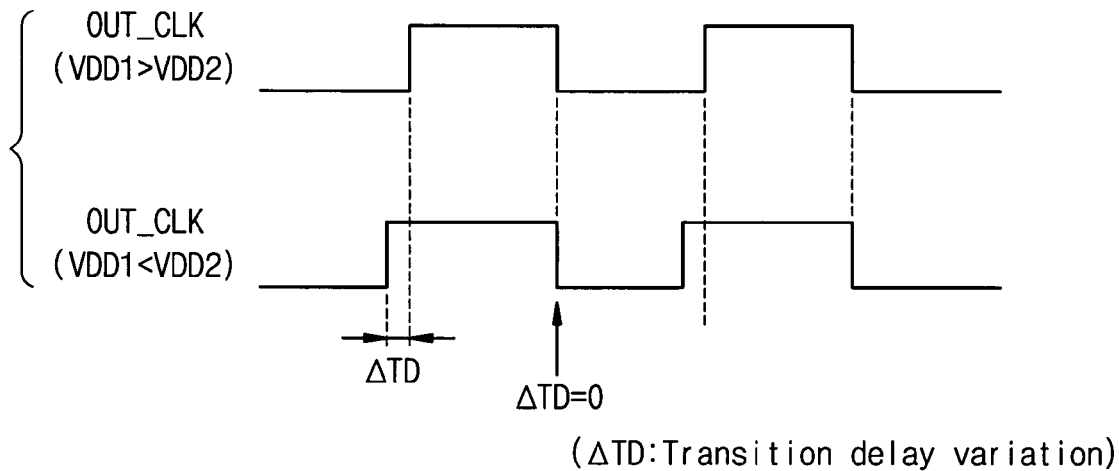
FIG. 3 is a timing diagram illustrating transition delay characteristics according to variations of input and output voltages.
Figure 4:
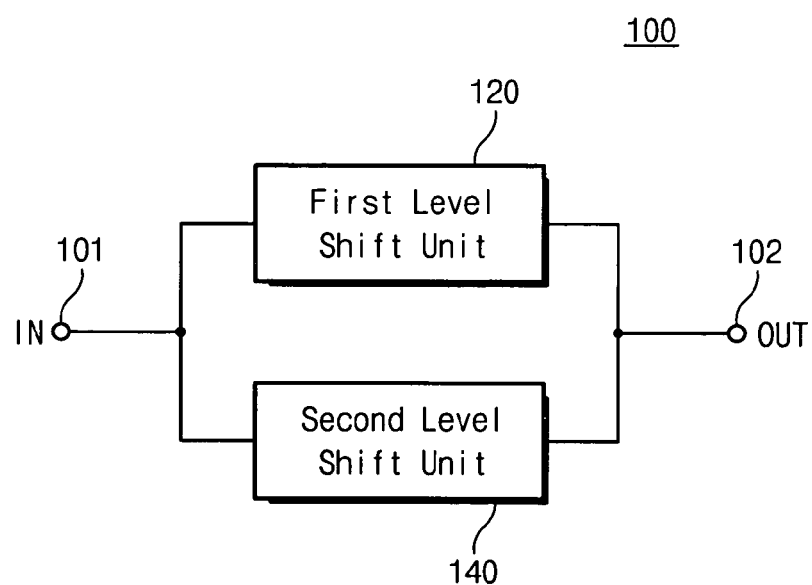
FIG. 4 is a block diagram of a voltage conversion circuit in accordance with the invention.

FIG. 4 is a block diagram of a voltage conversion circuit in accordance with an embodiment of the invention.

Referring to FIG. 4, the voltage conversion circuit 100 is comprised of first and second level-shifting units 120 and 140. The first level-shifting unit 120 is connected between an input terminal 101 to which an input signal IN is applied, and an output terminal 102 from which an output signal OUT is generated. The second level-shifting unit 140 is also connected between the input and output terminals 101 and 102. That is, the first and second level-shifting units, 120 and 140, are connected between the input and output terminals, 101 and 102, in parallel. The first and second level-shifting units, 120 and 140, are different from each other in transition delay characteristic. Specifically, the first and second level-shifting units, 120 and 140, are operable in complementary correlation with the different transition delay characteristics of each other, making the up and down-transition delay patterns variable in the same rate along a voltage change. As the up and down-transition delays proceed at the same rate, it is possible to maintain an initial duty ratio of a constant value, e.g., 50%, even with voltage variations in the circuit 100.

Figure 5A:
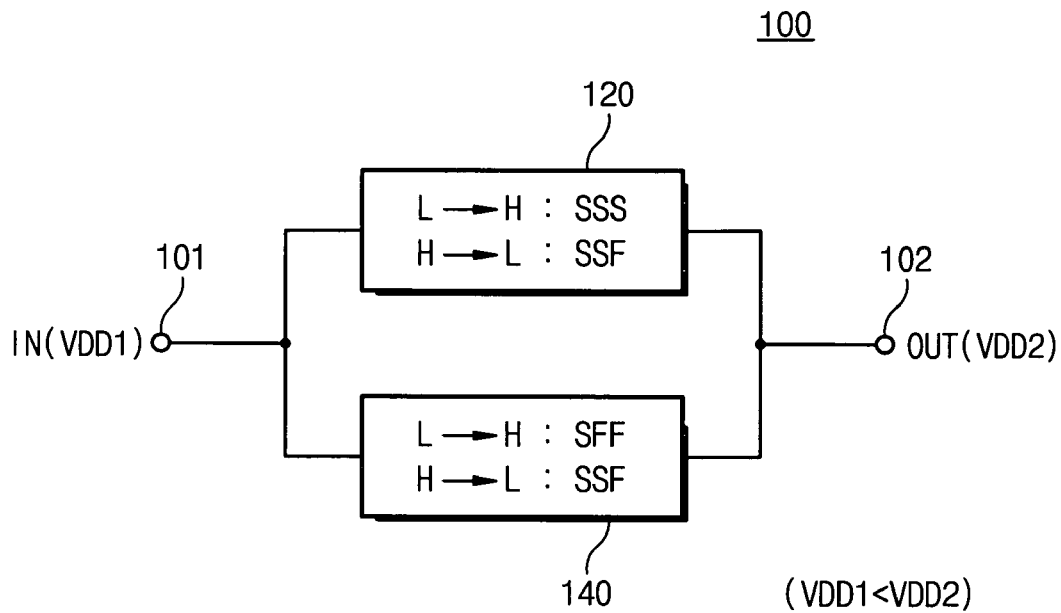
FIGS. 5A and 5B are block diagrams illustrating transition delay characteristics of the voltage conversion circuit shown in FIG. 4.

When the input signal IN with the first voltage VDD1 is converted into the output signal OUT with the second voltage VDD2, when the first voltage VDD1 is lower than the second voltage VDD2 (VDD1<VDD2), as illustrated in FIG. 5A, the first level-shifting unit 120 is configured to have a transition delay characteristic of 'SSF' during a high-to-low transition of the input signal IN and to have a transition delay characteristic of 'SSS' during a low-to-high transition of the input signal IN. Additionally, the second level-shifting unit 140 is configured to have a transition delay characteristic of 'SSF' during a high-to-low transition of the input signal IN, and to have a transition delay characteristic of 'SFF' during a low-to-high transition of the input signal IN. Thus, the output terminal 102 of FIG. 5A provides an average of the transition delay characteristics of the two conversion routes. Specifically, the down-transition delay is characterized by 'SSF' as the average of the 'SSS' and 'SSF' while the up-transition delay is characterized by 'SSF' as the average of the 'SFF' and 'SSF'.

Figure 5B:
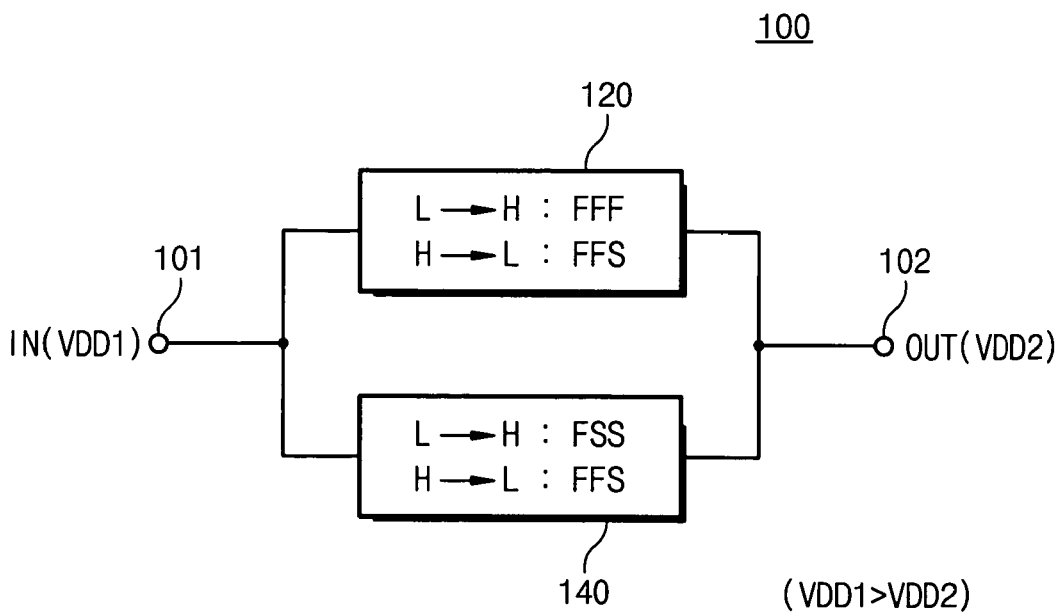

Alternatively, when the input signal IN with the first voltage VDD1 is converted into the output signal OUT with the second voltage VDD2, where the first voltage VDD1 is higher than the second voltage VDD2 (VDD1>VDD2), as illustrated in FIG. 5B, the first level-shifting unit 120 is configured to have a transition delay characteristic of 'FFS' during a high-to-low transition of the input signal IN, and to have a transition delay characteristic of 'FFF' during a low-to-high transition of the input signal IN. Additionally, the second level-shifting unit 140 is configured to have a transition delay characteristic of 'FFS' during a high-to-low transition of the input signal IN, and to have a transition delay characteristic of 'FSS' during a low-to-high transition of the input signal IN. Thus, the output terminal 102 of FIG. 5B provides an average of the transition delay characteristics of the two conversion routes. Specifically, the down-transition delay is characterized by 'FFS' as the average of the 'FFF' and 'FFS' while the up-transition delay is characterized by 'FFS' as the average of the 'FSS' and 'FFS'.

The following Table 2 summarizes the patterns of transition delays along voltage variations.

TABLE 2

| IN | VDD1 > VDD2 | VDD1 < VDD2 |
| --- | --- | --- |
| HIGH→LOW (VDD1→GND) | FFS | SSF |
| LOW→HIGH (GND→VDD1) | FFS | SSF |

Figure 6:
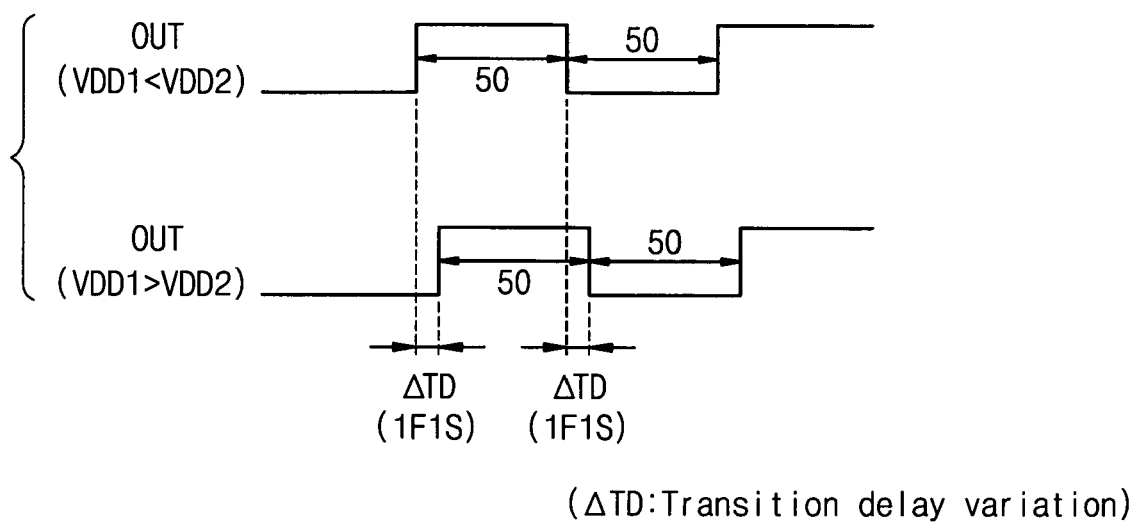
FIG. 6 is a timing diagram illustrating transition delay characteristics according to variations of input and output voltages.

As can be seen from the Table 2, when the first and second voltages, VDD1 and VDD2, are changing, the down-transition delay pattern turns to 'SSF' from 'FFS' or the reverse while the up-transition delay pattern turns to 'SSF' from 'FFS' or the reverse. Namely, the up and down-transition delay patterns vary in the same rate (e.g., by 1F1S). This means that the duty ratio of a signal (e.g., a clock signal) transferred through the circuit 100 by the invention is maintained at a constant rate even though there are variations in the first and second voltages VDD1 and VDD2. For instance, assuming that a duty ratio of the clock signal OUT_CLK is 50:50 under the condition of VDD1>VDD2, the duty ratio of the clock signal OUT_CLK is maintained at 50:50 even in VDD1<VDD2 as shown in FIG. 6. This result occurs, as aforementioned, because the up-transition delay pattern produced is the same as the down-transition delay pattern when the first and second voltages, VDD1 and VDD2, are changing.

FIGS. 7 through 15 are circuit diagrams illustrating the voltage conversion circuit in accordance with various embodiments of the invention. In FIGS. 7 through 15, the same elements in substance are depicted by the same reference numerals, without duplicate detailed explanation.

Figure 7:
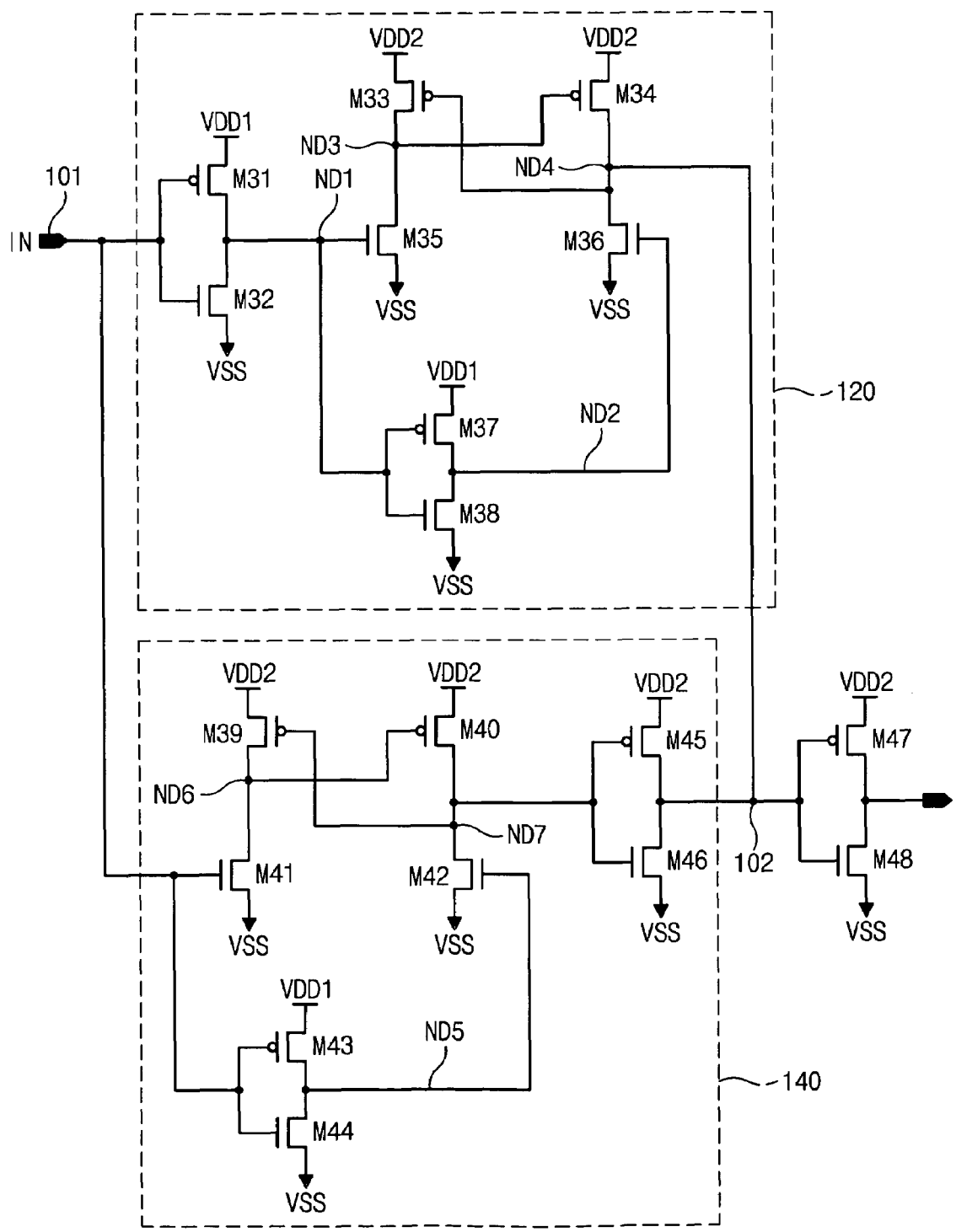
FIG. 7 shows a voltage conversion circuit in accordance with another embodiment of the invention.

First, referring to FIG. 7, the voltage conversion circuit 100 is comprised of the first and second level-shifting units 120 and 140 connected between the input and output terminals 101 and 102 in parallel.

The first level-shifting unit 120 includes four PMOS transistors, M31, M33, M34, and M37, and four NMOS transistors M32, M35, M36, and M38. The PMOS transistor M31 with a gate coupled to the input terminal 101 is connected between the first voltage VDD1 and a node ND1. The NMOS transistor M32 with a gate coupled to the input terminal 101 is connected between the node ND1 and the ground voltage. The PMOS transistor M37 is comprised of a gate coupled to the node ND1, a source connected to the first voltage VDD1, and a drain connected to a node ND2. The NMOS transistor M38 is comprised of a gate coupled to the node ND1, a drain connected to the node ND2, and a source grounded. The PMOS transistor M33 is connected between the second voltage VDD2 and a node ND3. The PMOS transistor M34 is connected between the second voltage VDD2 and a node ND4. The gates of the PMOS transistors M33 and M34 are cross-coupled to the nodes ND3 and ND4, respectively. The NMOS transistor M35 is connected between the node ND3 and the ground voltage, having a gate coupled to the node ND1. The NMOS transistor M36 has a gate coupled to the node ND2, being connected between the node ND4 and the ground voltage.

The second level-shifting unit 140 includes four PMOS transistors, M39, M40, M43, and M45, and four NMOS transistors M41, M42, M44, and M46. The PMOS transistor M43 is comprised of a gate coupled to the input terminal 101, a source connected to the first voltage VDD1, and a drain connected to a node ND5. The NMOS transistor M44 is comprised of a gate coupled to the input terminal 101, a drain connected to the node ND5, and a source grounded. The PMOS transistor M39 is connected between the second voltage VDD2 and a node ND6. The PMOS transistor M40 is connected between the second voltage VDD2 and a node ND7. Gates of the PMOS transistors M39 and M40 are cross-coupled to the nodes ND8 and ND7, respectively. The NMOS transistor M41 is connected between the node ND6 and the ground voltage, having a gate coupled to the input terminal 101. The NMOS transistor M42 has a gate coupled to the node ND6, being connected between the node ND7 and the ground voltage. The PMOS transistor M45 with a gate coupled to the node ND7 is connected between the output terminal 102 and the ground voltage. The output terminal 102 is further connected to an inverter that is comprised of PMOS and NMOS transistors, M47 and M48, and is supplied with the second voltage VDD2.

The PMOS and NMOS transistors, M33~M36, of the first level-shifting unit 120 constitute a differential amplifier. Also, the PMOS and NMOS transistors, M39~M42, of the second level-shifting unit 140 constitute a differential amplifier. In the circuit of FIG. 7, each inverter stage forms a signal transition stage.

If the first voltage VDD1 is lower than the second voltage VDD2, the MOS transistor is operable in the slow transition characteristic when its gate-source voltage is set on the first voltage VDD1, and operable in the fast transition characteristic when its gate-source voltage is set on the second voltage VDD2. When the input signal IN transitions to low level of the ground voltage from high level of the first voltage VDD1, the transistors, M31, M35, and M34, of the first level-shifting unit 120 are turned on and the transistors, M43, M42, and M45, of the second level-shifting unit 140 are turned on. Specifically, the first level-shifting unit 120 is operable in the transition delay characteristic of 'SSF', while the second level-shifting unit 140 is operable in the transition delay characteristic of 'SSF'. Thus, during the high-to-low transition of the input signal IN, a signal with the down-transition delay characteristic of 'SSF' as an average of the 'SSF' and 'SSF' is generated from the output terminal 102.

When the input signal IN transitions to high level of the first voltage VDD1 from low level of the ground voltage, the transistors, M32, M37, and M36, of the first level-shifting unit 120 are turned on and the transistors, M41, M40, and M46, of the second level-shifting unit 140 are turned on. Specifically, the first level-shifting unit 120 is operable in the transition delay characteristic of 'SSS', while the second level-shifting unit 140 is operable in the transition delay characteristic of 'SFF'. Thus, during the low-to-high transition of the input signal IN, a signal with the up-transition delay characteristic of 'SSF' as an average of the 'SSS' and 'SFF' is generated from the output terminal 102.

Alternatively, if the first voltage VDD1 is higher than the second voltage VDD2, when the input signal IN transitions to low level of the ground voltage from high level of the first voltage VDD1, the transistors, M31, M35, and M34, of the first level-shifting unit 120 are turned on and the transistors, M43, M42, and M45, of the second level-shifting unit 140 are turned on. Specifically, the first level-shifting unit 120 is operable in the transition delay characteristic of 'FFS', while the second level-shifting unit 140 is operable in the transition delay characteristic of 'FFS'. Thus, during the high-to-low transition of the input signal IN, a signal with the down-transition delay characteristic of 'FFS' as an average of the 'FFS' and 'FFS' is generated from the output terminal 102.

When the input signal IN transitions to high level of the first voltage VDD1 from low level of the ground voltage, the transistors, M32, M37, and M36, of the first level-shifting unit 120 are turned on and the transistors, M41, M40, and M46, of the second level-shifting unit 140 are turned on. Specifically, the first level-shifting unit 120 is operable in the transition delay characteristic of 'FFF', while the second level-shifting unit 140 is operable in the transition delay characteristic of 'FSS'. Thus, during the low-to-high transition of the input signal IN, a signal with the down-transition delay characteristic of 'FFS' as an average of the 'FFF' and 'FSS' is generated from the output terminal 102.

As can be seen from the description above, the voltage conversion circuit 100 operates by the transition delay characteristics shown in the Table 2. Namely, when the first and second voltages, VDD1 and VDD2, are changing, the down-transition delay pattern turns to 'SSF' from 'FFS' or the reverse while the up-transition delay pattern turns to 'SSF' from 'FFS' or the reverse. The up and down-transition delay patterns vary in the same rate (e.g., by 1F1S). As a result, the duty ratio of a signal (i.e., the output clock signal OUT) transferred through the circuit 100 by the invention is maintained at a constant rate even though there are variations in the first and second voltages VDD1 and VDD2. For instance, assuming that the duty ratio of the output clock signal OUT is 50:50 in the condition of VDD1<VDD2, the transition delay characteristic of the voltage conversion circuit 100 are changed when the first voltage VDD1 becomes higher than the second voltage VDD2. As aforementioned, the voltage conversion circuit 100 according to the invention is variable in the rate of the up and down-transition delay by '1F1S' when VDD1>VDD2. As illustrated in FIG. 6, relative to the case of VDD1<VDD2, the up and down-transition delays of the output clock signal OUT in the condition of VDD1>VDD2 are changed at the same rate by ΔTD (1F1S). That is, the output clock signal OUT is maintained at 50:50 in duty ratio. Thus, it is able to minimize the clock skew in the voltage conversion circuit even when the input and output voltages thereof are varying.

Figure 8:
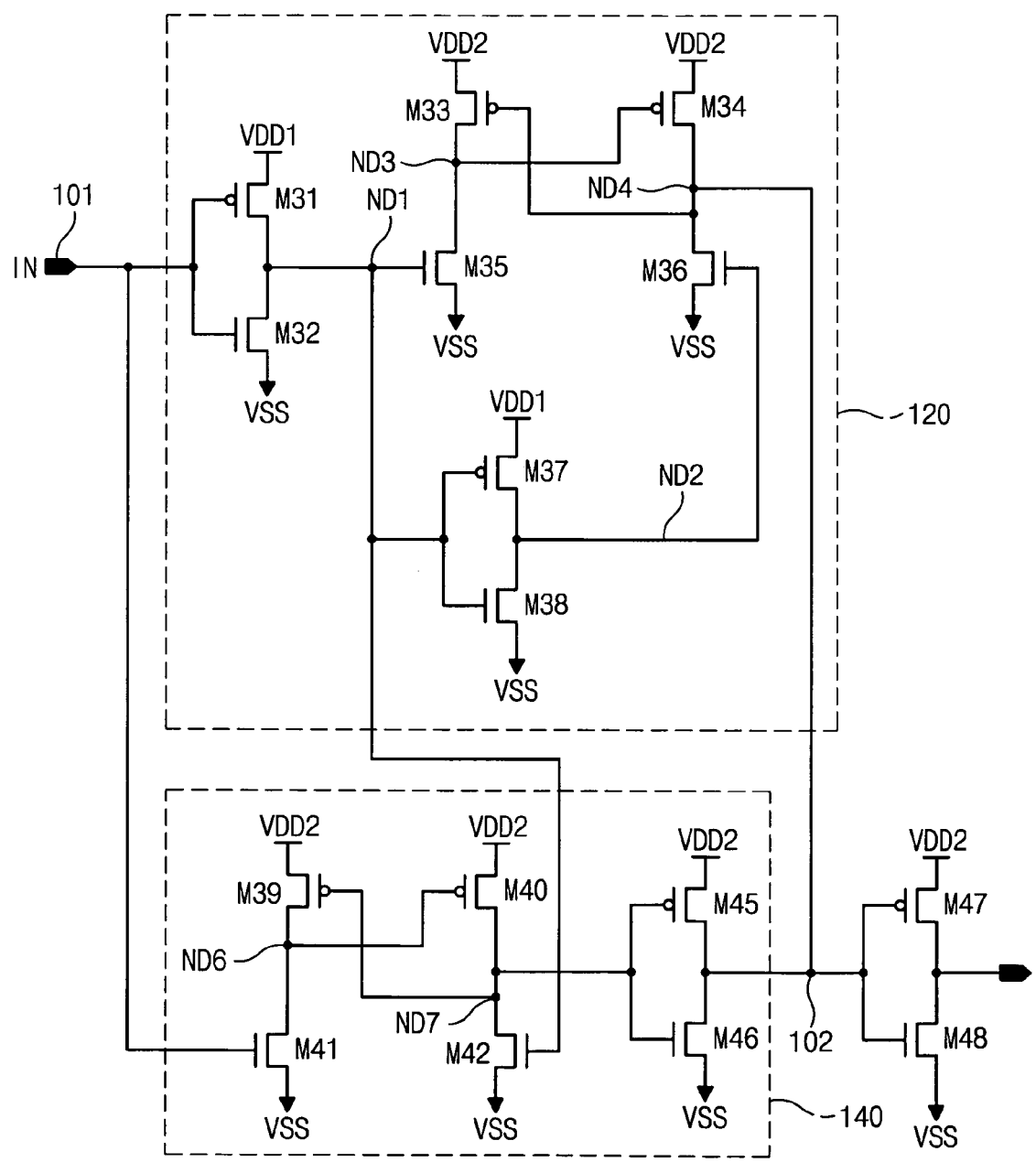
FIG. 8 shows a voltage conversion circuit in accordance with another embodiment of the invention.

FIG. 8 illustrates a type of voltage conversion circuit in a second embodiment of the invention. The voltage conversion circuit 100 shown in FIG. 8 is substantially identical to that shown in FIG. 7, except the gate of the NMOS transistor M42 is connected to the node ND1 without the PMOS and NMOS transistors, M43 and M44. The circuit 100 of FIG. 8 operates in the same transition delay pattern and produces the same effect as that of FIG. 7, and therefore will not be discussed in further detail.

Figure 9:
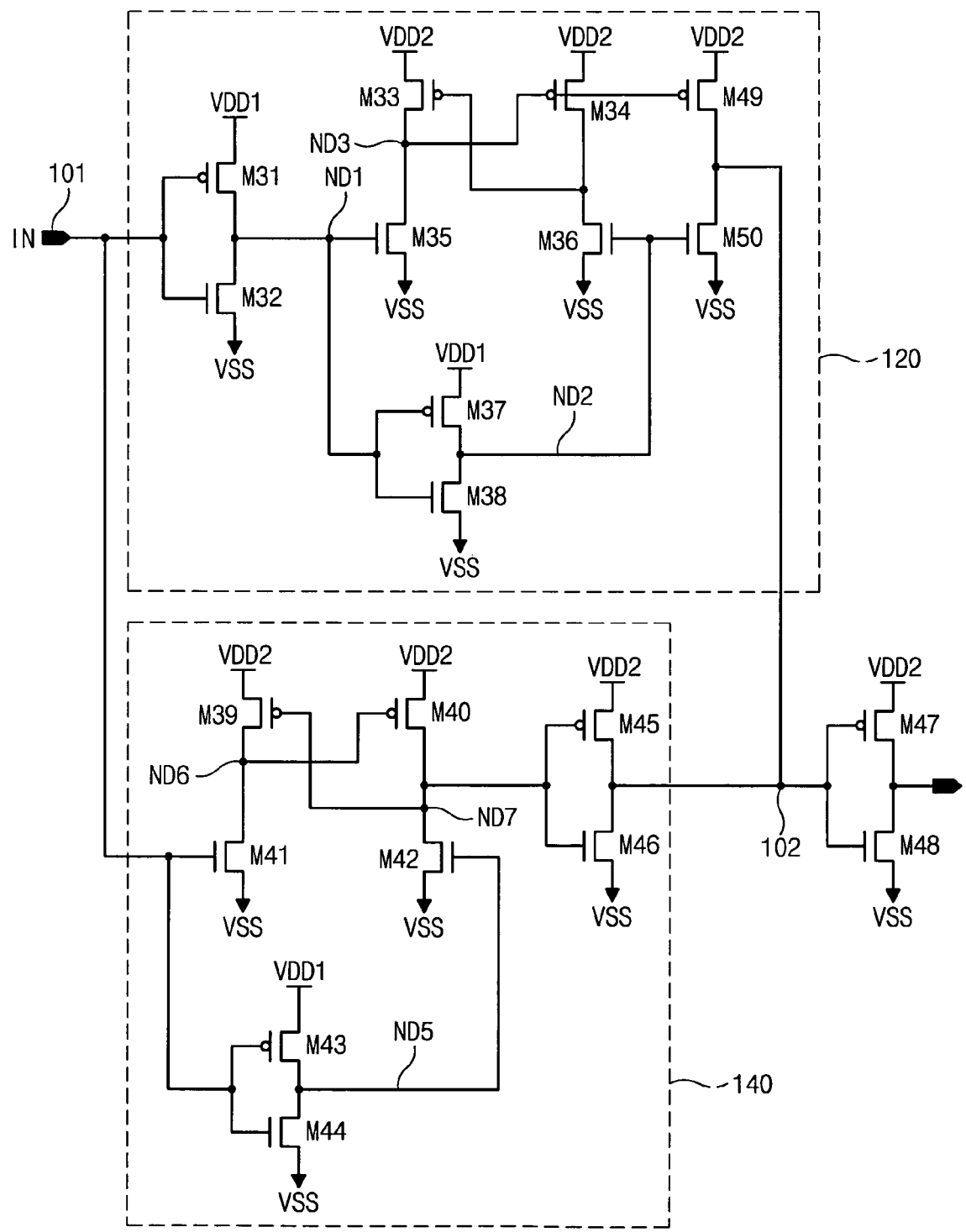
FIG. 9 shows a voltage conversion circuit in accordance with another embodiment of the invention.

FIG. 9 illustrates a type of voltage conversion circuit in a third embodiment of the invention.

Referring to FIG. 9, the voltage conversion circuit 100 shown in FIG. 9 is substantially identical with that shown in FIG. 7, except for the additional PMOS and NMOS transistors, M49 and M50. The PMOS transistor M49 is composed of a gate coupled to the node ND1, a source connected to the second voltage VDD2, and a drain connected to the output terminal 102. The NMOS transistor M50 has a drain connected to the output terminal 102, a source grounded, and a gate coupled to the node ND2. The PMOS and NMOS transistors, M49 and M50, are provided to isolate the cross-coupling node, i.e., the node ND4, from the second level-shifting unit 140. In addition, the PMOS and NMOS transistors, M49 and M50, operate to pull-up and down a voltage level at the output terminal 102 in accordance with logic states of the nodes ND4 and ND1, which are the same as the functions of the PMOS and NMOS transistors M34 and M36. The circuit 100 of FIG. 9 operates in the same transition delay pattern and produces the same effect as that of FIG. 7, and therefore will not be discussed in further detail.

Figure 10:
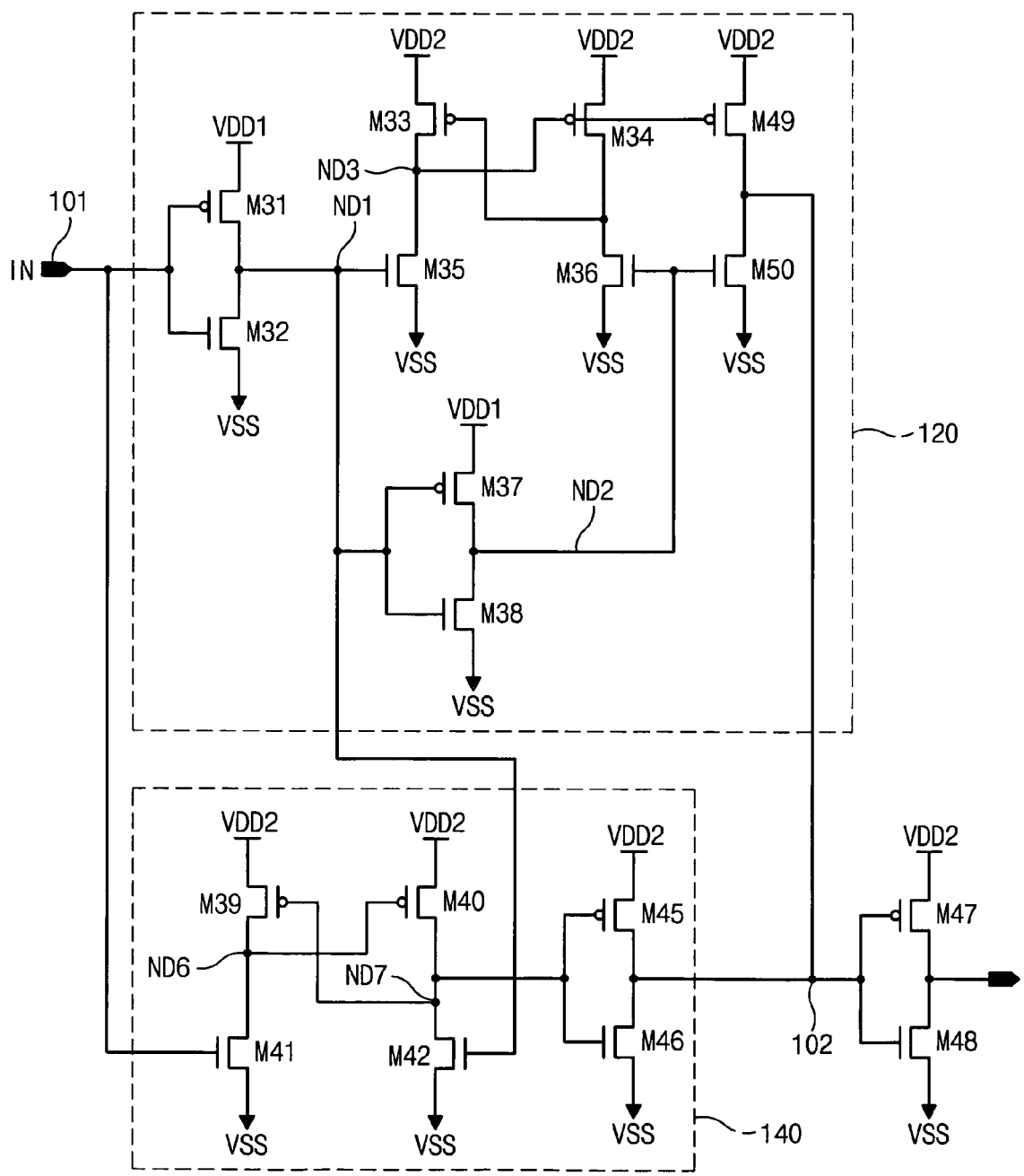
FIG. 10 shows a voltage conversion circuit in accordance with another embodiment of the invention.

FIG. 10 illustrates a type of voltage conversion circuit in a fourth embodiment of the invention. The voltage conversion circuit 100 shown in FIG. 10 is substantially identical as that shown in FIG. 9, except that the gate of the NMOS transistor M42 is connected to the node ND1 without the PMOS and NMOS transistors M43 and M44. The circuit 100 of FIG. 10 operates in the same transition delay pattern and produces the same effect as that of FIG. 7, and therefore will not be discussed in further detail.

Figure 11:
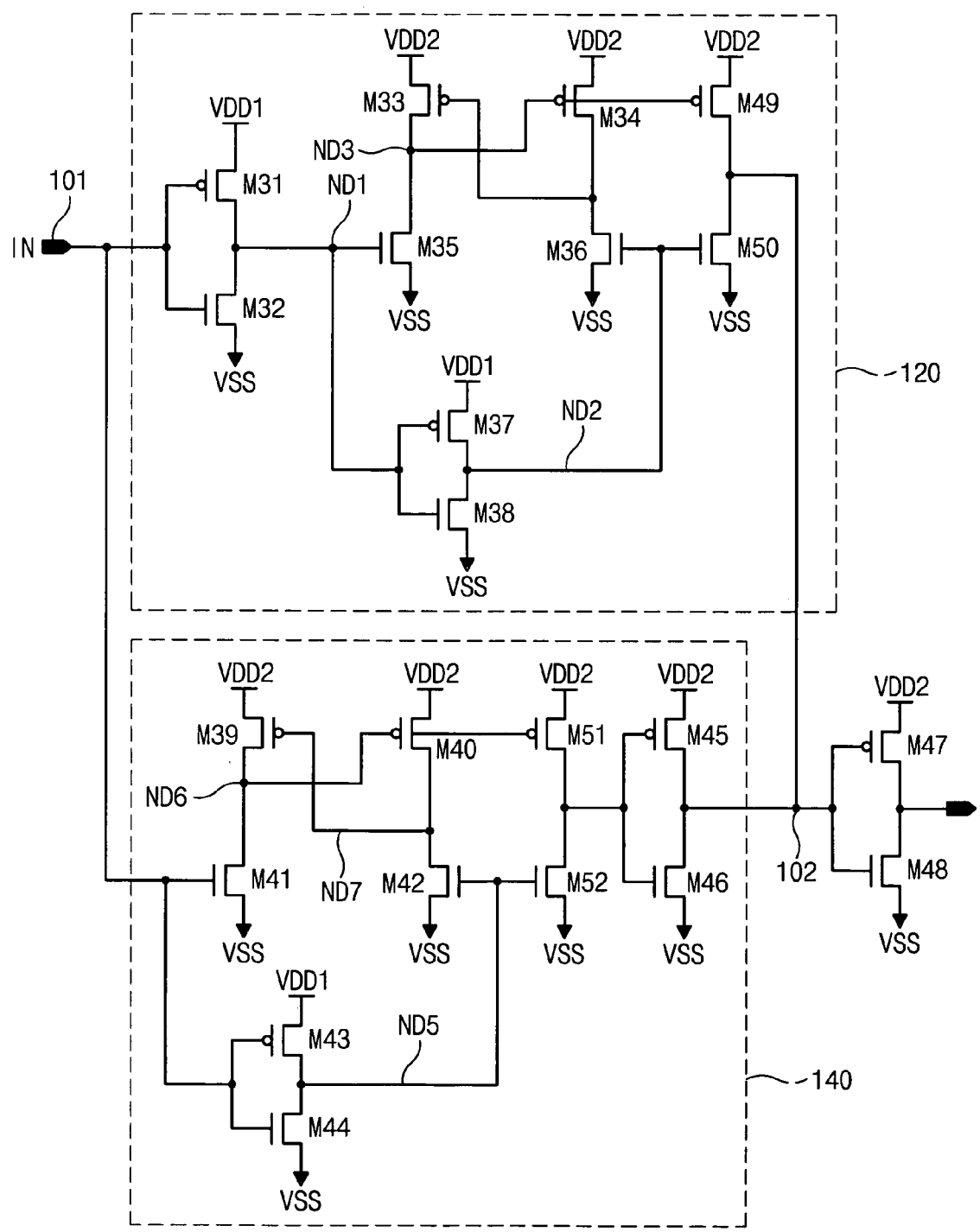
FIG. 11 shows a voltage conversion circuit in accordance with another embodiment of the invention.

FIG. 11 illustrates a type of voltage conversion circuit by a fifth embodiment of the invention.

The voltage conversion circuit 100 shown in FIG. 11 is substantially identical as that shown in FIG. 9, except for the addition of PMOS and NMOS transistors, M51 and M52, in the second level-shifting unit 140. The PMOS and NMOS transistors, M51 and M52, are provided to isolate the cross-coupling node, i.e., the node ND7, from a common gate node of the transistors M45 and M46. In addition, the PMOS and NMOS transistors, M51 and M52, operate to pull-up and down a voltage level at the common gate node of the transistors M45 and M46 in accordance with logic states of the nodes ND6 and ND5, which are the same as the functions of the PMOS and NMOS transistors M40 and M42. The circuit 100 of FIG. 11 operates in the same transition delay pattern and has the same effect as that of FIG. 7, and therefore will not be discussed in further detail.

Figure 12:
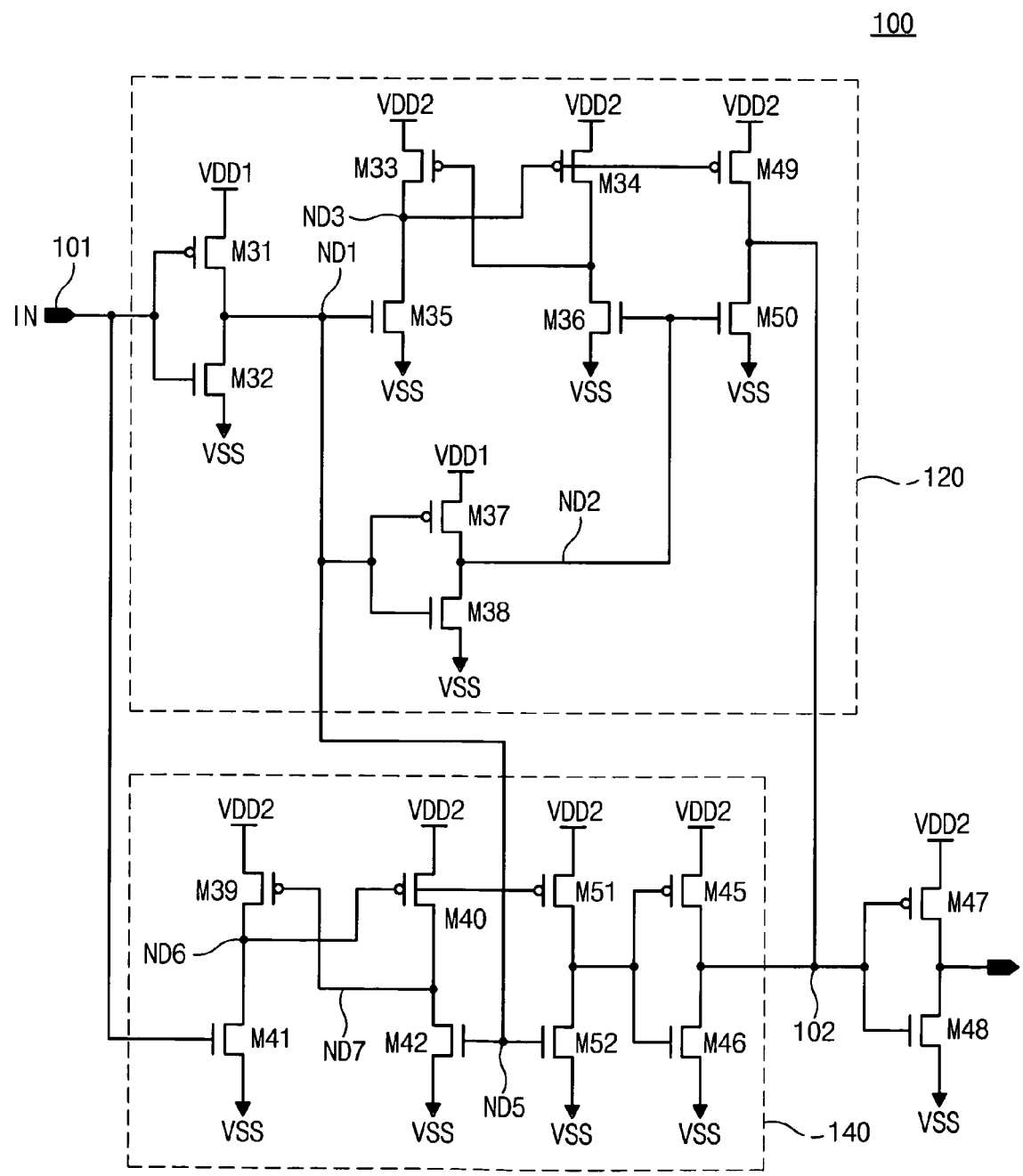
FIG. 12 shows a voltage conversion circuit in accordance with another embodiment of the invention.

Another voltage conversion circuit in a sixth embodiment of the invention is illustrated in FIG. 12. The voltage conversion circuit 100 shown in FIG. 12 is substantially identical to that shown in FIG. 7, except that the gates of the NMOS transistors M42 and M52 are electrically connected to the node ND1 without the PMOS and NMOS transistors M43 and M44. The circuit 100 of FIG. 12 operates in the same transition delay pattern and has the same effect as that of FIG. 7, and therefore will not be discussed in further detail.

Figure 13:
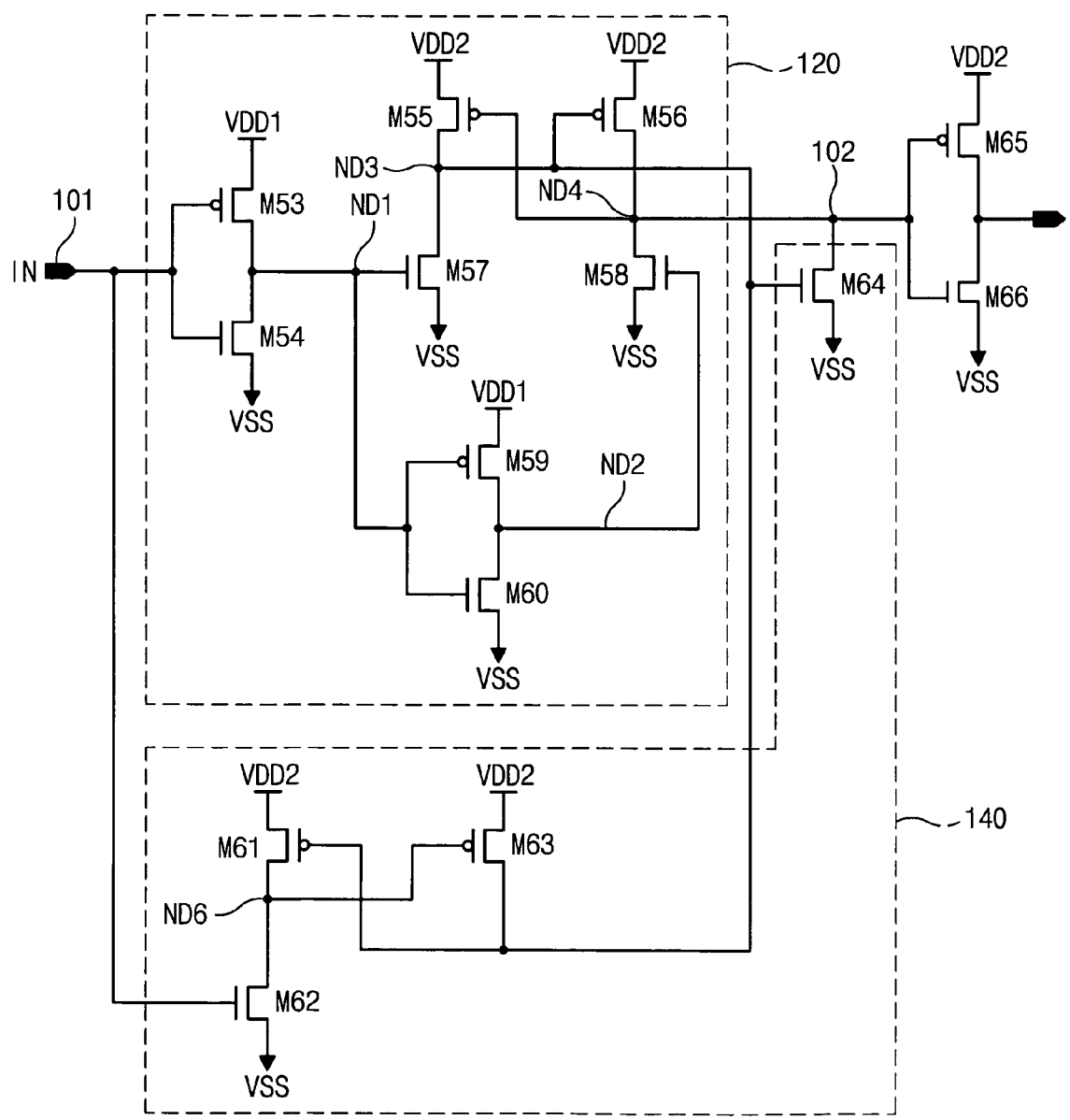
FIG. 13 shows a voltage conversion circuit in accordance with another embodiment of the invention.

FIG. 13 shows another voltage conversion circuit in a seventh embodiment of the invention.

Referring to FIG. 13, the voltage conversion circuit 100 is comprised of six PMOS transistors, M53, M55, M56, M59, M61, and M63, and six NMOS transistors M54, M57, M58, M60, M62, and M64. The transistors M53~M60 constitute the first level-shifting unit 120, while the transistors M61~M64 constitute the second level-shifting unit 140. As the transistors M53~M60 of the first level-shifting unit 120 are interconnected in the same pattern as those of FIG. 7, it will not be discussed in further detail. The PMOS transistor M61 is connected between the second voltage VDD2 and the node ND6, having a gate coupled to the node ND3. The NMOS transistor M62 with a gate coupled to the input terminal 101 is connected between the node ND6 and the ground voltage. The PMOS transistor M63 is connected between the second voltage VDD2 and the node ND3, having a gate coupled to the node ND6. The NMOS transistor M64 with a gate coupled to the node ND3 has a drain connected to the node ND3 that is the output terminal 102, and a source grounded.

The voltage conversion circuit 100 shown in FIG. 13 has three signal transmission routes. The first and second level-shifting units, 120 and 140, each provide signal transmission routes during the low-to-high transition of the input signal IN. However, during the high-to-low transition of the input signal IN, there is only one signal transmission route in the first level-shifting unit 120. Specifically, during the low-to-high transition of the input signal IN, the first level-shifting unit 120 has a signal transmission route formed of the transistors, M54, M59, and M58, and the second level-shifting unit 140 has a signal transmission route formed of the transistors M62~M64. Alteratively, during the high-to-low transition of the input signal IN, the first level-shifting unit 120 has a single signal transmission route formed of the transistors, M53, M57, and M56, and the second level-shifting unit 140 has none.

If the first voltage VDD1 is higher than the second voltage VDD2 (VDD 1>VDD2), when the input signal IN goes to high level of the first voltage VDD1 from low level of the ground voltage, the first level-shifting unit 120 is operable in the transition delay characteristic of 'FFF' while the second level-shifting unit 140 is operable in the transition delay characteristic of 'FSS'. Thus, during the high-to-low transition of the input signal IN, a signal with the down-transition delay characteristic of 'FFS' as an average of the 'FFF' and 'FSS' is generated from the output terminal 102. When the input signal IN goes to low level of the ground voltage from high level of the first voltage VDD1, the first level-shifting unit 120 is operable in the transition delay characteristic of 'FSS'. Thus, during the low-to-high transition of the input signal IN, a signal with the down-transition delay characteristic of 'FSS' is generated from the output terminal 102.

Alternatively, if the first voltage VDD1 is lower than the second voltage VDD2 (VDD1<VDD2), when the input signal IN goes to high level of the first voltage VDD1 from low level of the ground voltage, the first level-shifting unit 120 is operable in the transition delay characteristic of 'SSS' while the second level-shifting unit 140 is operable in the transition delay characteristic of 'SFF'. Thus, during the high-to-low transition of the input signal IN, a signal with the down-transition delay characteristic of 'SSF' as an average of the 'SSS' and 'SFF' is generated from the output terminal 102. When the input signal IN goes to low level of the ground voltage from high level of the first voltage VDD1, the first level-shifting unit 120 is operable in the transition delay characteristic of 'SFF'. Thus, during the low-to-high transition of the input signal IN, a signal with the down-transition delay characteristic of 'SFF' is generated from the output terminal 102. Therefore, since the up and down-transition delays are variable by '1F1S' when the voltage condition changes to VDD1>VDD2 from VDD1<VDD2, the duty ratio of the output clock signal is maintained at a constant level.

Figure 14:
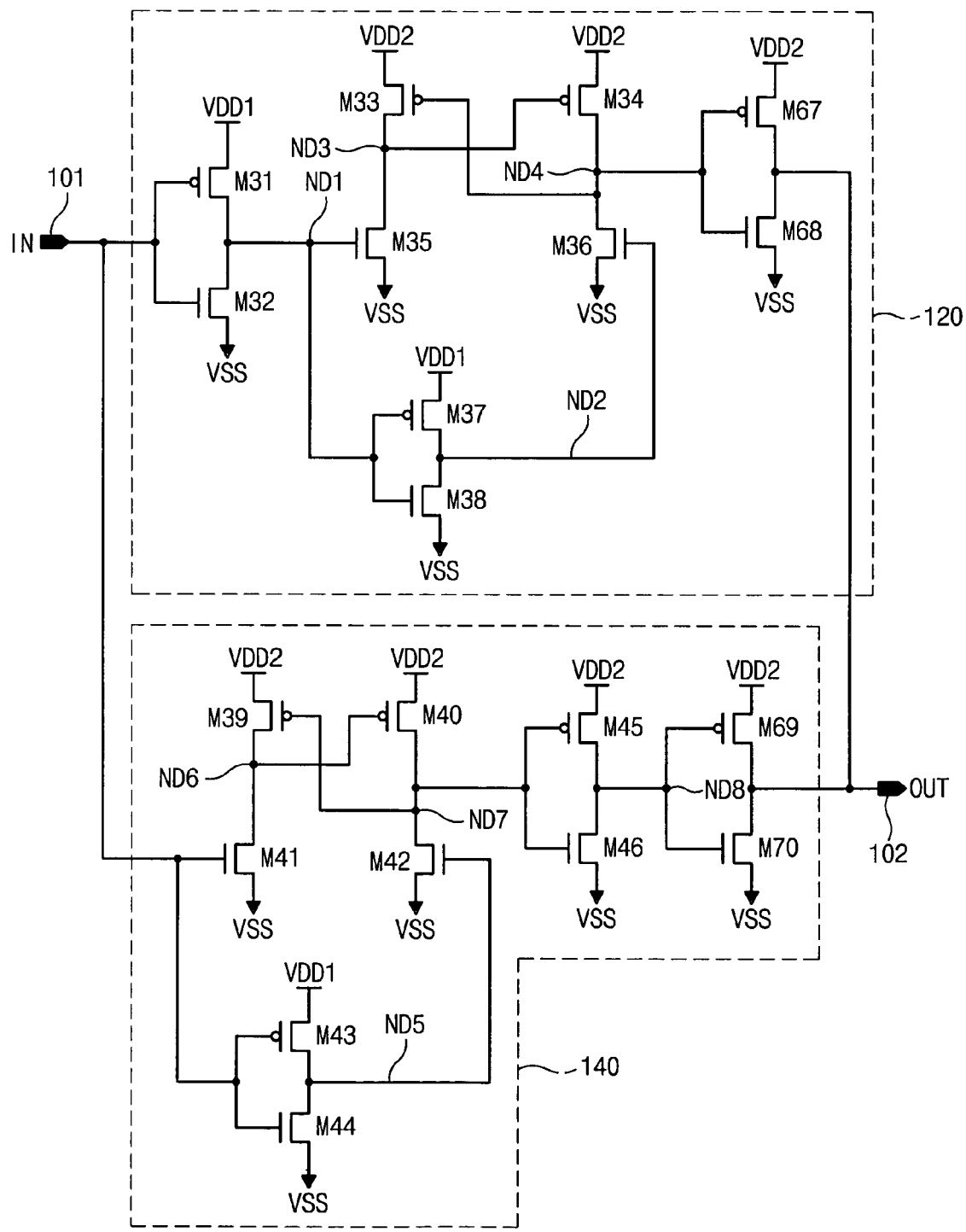
FIG. 14 shows a voltage conversion circuit in accordance with another embodiment of the invention.

FIG. 14 illustrates another type of voltage conversion circuit in an eighth embodiment of the invention.

Referring to FIG. 14, the voltage conversion circuit 100 is comprised of the first and second level-shifting units 120 and 140 connected between the input and output terminals 101 and 102 in parallel.

The first level-shifting unit 120 includes five PMOS transistors, M31, M33, M34, M37, and M67, and five NMOS transistors M32, M35, M36, M38, and M68. The PMOS transistor M31 with a gate coupled to the input terminal 101 is connected between the first voltage VDD1 and the node ND1. The NMOS transistor M32 with a gate coupled to the input terminal 101 is connected between the node ND1 and the ground voltage. The PMOS transistor M37 is comprised of a gate coupled to the node ND1, a source connected to the first voltage VDD1, and a drain connected to the node ND2. The NMOS transistor M38 is comprised of a gate coupled to the node ND1, a drain connected to the node ND2, and a source grounded. The PMOS transistor M33 is connected between the second voltage VDD2 and the node ND3. The PMOS transistor M34 is connected between the second voltage VDD2 and the node ND4. The gates of the PMOS transistors M33 and M34 are cross-coupled to the nodes ND3 and ND4, respectively. The NMOS transistor M35 is connected between the node ND3 and the ground voltage, having a gate coupled to the node ND1. The NMOS transistor M36 has a gate coupled to the node ND2, being connected between the node ND4 and the ground voltage. The PMOS transistor M67 is comprised of a gate coupled to the node ND4, a source connected to the second voltage VDD2, and a drain connected to the output terminal 102. The NMOS transistor M68 is comprised of a gate coupled to the node ND4, a drain connected to the output terminal 102, and a source connected to the ground voltage.

The second level-shifting unit 140 includes five PMOS transistors, M39, M40, M43, M45, and M69, and five NMOS transistors M41, M42, M44, M46, and M70. The PMOS transistor M43 is comprised of a gate coupled to the input terminal 101, a source connected to the first voltage VDD1, and a drain connected to the node ND5. The NMOS transistor M44 is comprised of a gate coupled to the input terminal 101, a drain connected to the node ND5, and a source grounded. The PMOS transistor M39 is connected between the second voltage VDD2 and the node ND6. The PMOS transistor M40 is connected between the second voltage VDD2 and the node ND7. Gates of the PMOS transistors M39 and M40 are cross-coupled to the nodes ND8 and ND7, respectively. The NMOS transistor M41 is connected between the node ND6 and the ground voltage, having a gate coupled to the input terminal 101. The NMOS transistor M42 has a gate coupled to the node ND6, being connected between the node ND7 and the ground voltage. The PMOS transistor M45 has a gate coupled to the node ND7 and is connected between the second voltage VDD2 and the node ND8. The NMOS transistor M46 has a gate coupled to the node ND7 and is connected between the node ND8 and the ground voltage. The PMOS transistor M69 is comprised of a gate coupled to the node ND8, a source connected to the second voltage VDD2, and a drain connected to the output terminal 102. The NMOS transistor M70 is comprised of a gate coupled to the node ND8, a drain connected to the output terminal 102, and a source connected to the ground voltage.

First, if the first voltage VDD1 is lower than the second voltage VDD2, the MOS transistor is operable in the slow transition characteristic when its gate-source voltage is set to the first voltage VDD1, and operable in the fast transition characteristic when its gate-source voltage is set to the second voltage VDD2. When the input signal IN transitions to low level of the ground voltage from high level of the first voltage VDD1, the transistors, M31, M35, M34, and M68, of the first level-shifting unit 120 are turned on and the transistors, M43, M42, M45, and M70, of the second level-shifting unit 140 are turned on. Specifically, the first level-shifting unit 120 operates in the transition delay characteristic of 'SSFF', while the second level-shifting unit 140 operates in the transition delay characteristic of 'SSFF'. Thus, during the high-to-low transition of the input signal IN, a signal with the down-transition delay characteristic of 'SSFF' as an average of the 'SSFF' and 'SSFF' is generated from the output terminal 102.

When the input signal IN goes to high level of the first voltage VDD1 from low level of the ground voltage, the transistors, M32, M37, M36, and M67, of the first level-shifting unit 120 are turned on and the transistors, M41, M40, M46, and M69, of the second level-shifting unit 140 are turned on. Specifically, the first level-shifting unit 120 operates in the transition delay characteristic of 'SSSF', while the second level-shifting unit 140 operates in the transition delay characteristic of 'SFFF'. Thus, during the low-to-high transition of the input signal IN, a signal with the up-transition delay characteristic of 'SSSF' as an average of the 'SSSF' and 'SFFF' is generated from the output terminal 102.

Alternatively, if the first voltage VDD1 is higher than the second voltage VDD2 (VDD1>VDD2), when the input signal IN transitions to low level of the ground voltage from high level of the first voltage VDD1, the transistors, M31, M35, M34, and M68, of the first level-shifting unit 120 are turned on and the transistors, M43, M42, M45, and M70, of the second level-shifting unit 140 are turned on. This means that the first level-shifting unit 120 is operable in the transition delay characteristic of 'FFSS', while the second level-shifting unit 140 is operable in the transition delay characteristic of 'FFSS'. Thus, during the high-to-low transition of the input signal IN, a signal with the down-transition delay characteristic of 'FFSS' as an average of the 'FFSS' and 'FFSS' is generated from the output terminal 102.

When the input signal IN transitions to high level of the first voltage VDD1 from low level of the ground voltage, the transistors, M32, M37, M36, and M67, of the first level-shifting unit 120 are turned on and the transistors, M41, M40, M46, and M69, of the second level-shifting unit 140 are turned on. This means that the first level-shifting unit 120 is operable in the transition delay characteristic of 'FFFS', while the second level-shifting unit 140 is operable in the transition delay characteristic of 'FSSS'. Thus, during the low-to-high transition of the input signal IN, a signal with the down-transition delay characteristic of 'FFSS' as an average of the 'FFFS' and 'FSSS' is generated from the output terminal 102.

As can be seen from the description above, when the first and second voltages, VDD1 and VDD2, are changing, the down-transition delay pattern turns to 'SSFF' from 'FFSS' or the reverse while the up-transition delay pattern turns to 'SSFF' from 'FFSS' or the reverse. This means that the up and down-transition delay patterns vary by the same rate. As a result, the duty ratio of a signal (i.e., the output clock signal) transferred through the circuit 100 by the invention is maintained at a constant rate even though there are variations in the first and second voltages VDD1 and VDD2.

Figure 15:
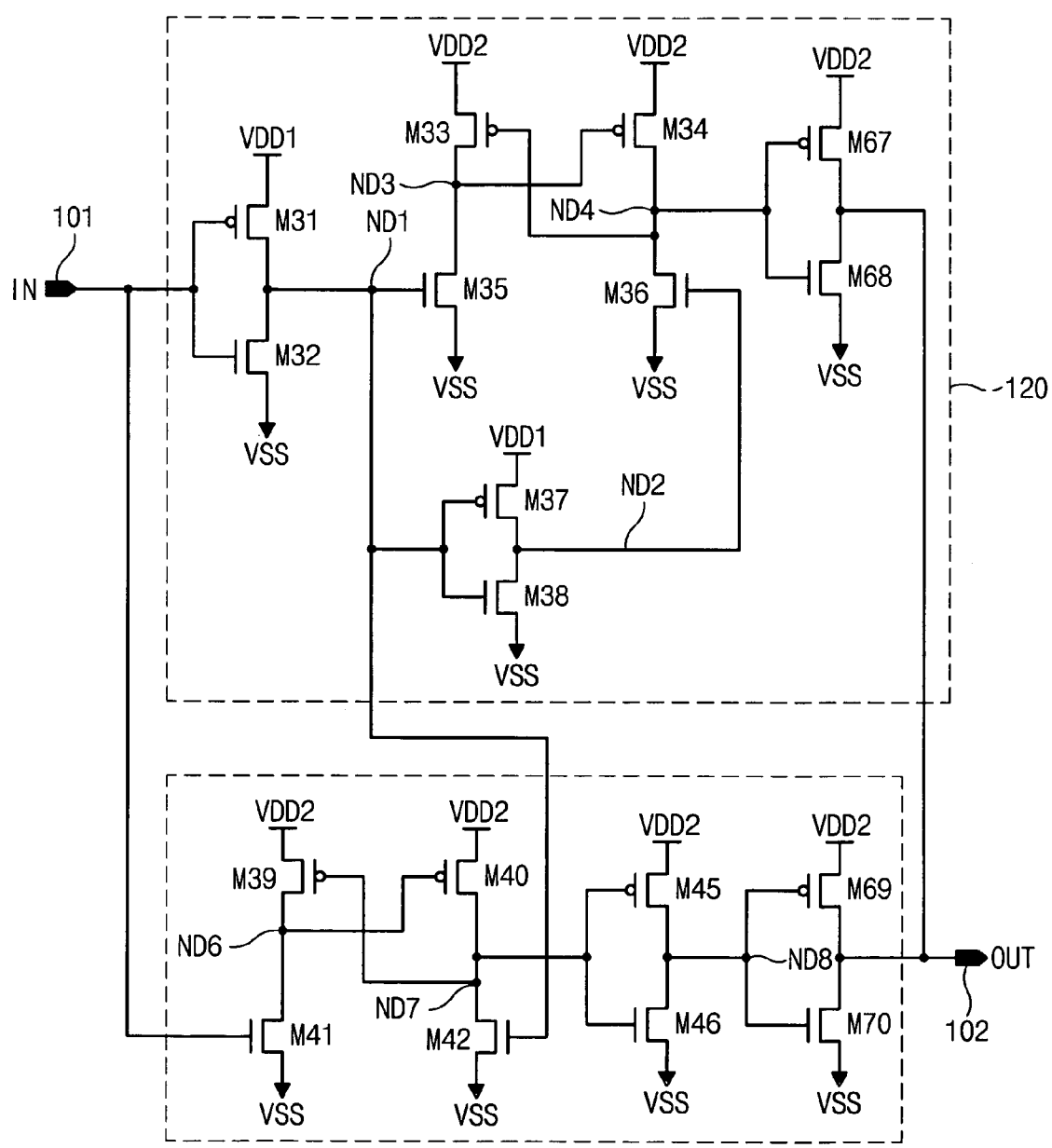
FIG. 15 shows a voltage conversion circuit in accordance with another embodiment of the invention.

Another type of voltage conversion circuit in a ninth embodiment of the invention is illustrated in FIG. 15. The voltage conversion circuit 100 shown in FIG. 15 is substantially identical to that shown in FIG. 14, except that the gate of the NMOS transistor M42 is connected to the node ND1 without the PMOS and NMOS transistors, M43 and M44. Therefore, it will not be discussed in further detail.

As described above, it is possible for the voltage conversion circuit to maintain a duty ratio of a transmission signal (e.g., an output clock signal) at a constant level by varying the up and down-transition delays of the output signal at the same rate when input and output voltages are changing.

While there has been illustrated and described what are presently considered to be examplary embodiments of the present invention, it will be understood by those skilled in the art that various other modifications may be made, and equivalents may be substituted, without departing from the true scope of the invention. Therefore, it is intended that the present invention not be limited to the particular embodiments disclosed, but that the invention include all embodiments falling within the scope of the appended claims.

What is claimed is:

1. A voltage conversion circuit, comprising:
   an input terminal receiving an input signal of a first voltage;
   an output terminal generating an output signal of a second voltage; and
   first and second level-shifting units connected between the input and output terminals,
   wherein the first and second level-shifting units have different transition delay characteristics from each other so that rising and falling transition delays of the output signal are varied in the same rate when the first and second voltages are changed,
   wherein when the first voltage is higher than the second voltage and the input signal goes to high level from low level, the signal transmission stages of the first level-shifting unit operate in a transition delay characteristic of 'FFF' and the signal transmission stages of the second level-shifting unit operate in a transition delay characteristic of 'FSS',
   wherein the 'F' represents a fast transition delay of a MOS transistor based on a gate-source voltage and the 'S' represents a slow transition delay of a MOS transistor based on a gate-source voltage.

2. The voltage conversion circuit as set forth in claim 1, wherein each of the first and second level-shifting units has three signal transmission stages.

3. The voltage conversion circuit as set forth in claim 1, wherein when the first voltage is higher than the second voltage and the input signal goes to low level from high level, the signal transmission stages of the first level-shifting unit operate in a transition delay characteristic of 'FFS' and the signal transmission stages of the second level-shifting unit operate in a transition delay characteristic of 'FFS'.

4. The voltage conversion circuit as set forth in claim 1, wherein when the first voltage is lower than the second voltage and the input signal goes to high level from low level, the signal transmission stages of the first level-shifting unit operate in a transition delay characteristic of 'SSS' and the signal transmission stages of the second level-shifting unit operate in a transition delay characteristic of 'SFF'.

5. The voltage conversion circuit as set forth in claim 1, wherein when the first voltage is lower than the second voltage and the input signal goes to low level from high level, the signal transmission stages of the first level-shifting unit operate in a transition delay characteristic of 'SSF' and the signal transmission stages of the second level-shifting unit operate in a transition delay characteristic of 'SSF'.

6. The voltage conversion circuit as set forth in claim 1, which further comprises:
   an inverter connected to the output terminal, being supplied with the second voltage.

7. A voltage conversion circuit comprising:
   an input terminal receiving an input signal of a first voltage;
   an output terminal generating an output signal of a second voltage; and
   first and second level-shifting units connected between the input and output terminals,
   wherein the first and second level-shifting units have different transition delay characteristics from each other so that rising and falling transition delays of the output signal are varied in the same rate when the first and second voltages are changed,
   wherein the first level-shifting unit comprises:
   a first inverter connected to the input terminal;
   a second inverter connected to the output of the first inverter; and
   a first differential amplifier driving the output terminal with one of the second voltage and a ground voltage in response to outputs of the first and second inverters,
   wherein the first and second inverters are supplied with the first voltage, and the first differential amplifier is supplied with the second voltage.

8. The voltage conversion circuit as set forth in claim 7, wherein the first level-shifting unit further comprises an isolation circuit to electrically disconnect the output terminal from a first cross-coupling node of the first differential amplifier.

9. The voltage conversion circuit as set forth in claim 8, wherein the second level-shifting unit comprises:
   a third inverter connected to the input terminal;
   a second differential amplifier generating a signal with one of the second voltage and a ground voltage in response to the input signal and an output of the third inverter; and
   a fourth inverter connected between an output of the second differential amplifier and the output terminal,
   wherein the third inverter is supplied with the first voltage, and the second differential amplifier and the fourth inverter are supplied with the second voltage.

10. The voltage conversion circuit as set forth in claim 9, wherein the isolation circuit comprises:
    a PMOS transistor connected between the second voltage and the output terminal, having a gate coupled to a second cross-coupling node of the first differential amplifier; and
    a NMOS transistor connected between the output terminal and the ground voltage, having a gate coupled to the output of the second differential amplifier.

11. The voltage conversion circuit as set forth in claim 7, wherein the second level-shifting unit comprises:
    a second differential amplifier generating a signal with one of the second voltage and a ground voltage in response to the input signal and an output of the first inverter; and
    a third inverter connected between an output of the second differential amplifier and the output terminal,
    wherein the second differential amplifier and the third inverter are supplied with the second voltage.

12. The voltage conversion circuit as set forth in claim 7, wherein the second level-shifting unit comprises:
    a first PMOS transistor connected between the second voltage and an internal node, having a gate coupled to a first cross-coupling node of the first differential amplifier;
    a first NMOS transistor connected between the internal node and the ground voltage, having a gate coupled to the input terminal;
    a second PMOS transistor connected between the second voltage and the first cross-coupling node, having a gate coupled to the internal node; and a second NMOS transistor connected between the output terminal and the ground voltage, having a gate coupled to a second cross-coupling node of the first differential amplifier.

13. The voltage conversion circuit as set forth in claim 12, wherein the first cross-coupling node of the first differential amplifier is connected to the output terminal.

14. A voltage conversion circuit to generate an output signal of a second voltage from an input signal of a first voltage, comprising:
an input terminal receiving the input signal;
an output terminal generating the output signal; and
first and second level-shifting units connected between the input and output terminals in parallel,
wherein the first and second level-shifting units each have four signal transmission stages and different transition delay characteristics from each other so that rising and falling transition delays of the output signal are varied in the same rate when the first and second voltages are changed,
wherein when the first voltage is higher than the second voltage and the input signal goes to high level from low level, the signal transmission stages of the first level-shifting unit operate in a transition delay characteristic of 'FFFS' and the signal transmission stages of the second level-shifting unit operate in a transition delay characteristic of 'FSSS'.
where the 'F' represents a fast transition delay of a MOS transistor based on a gate-source voltage and the 'S' represents a slow transition delay of a MOS transistor based on a gate-source voltage.

15. The voltage conversion circuit as set forth in claim 14, wherein when the first voltage is higher than the second voltage and the input signal goes to low level from high level, the signal transmission stages of the first level-shifting unit operate in a transition delay characteristic of 'FFSS' and the signal transmission stages of the second level-shifting unit operate in a transition delay characteristic of 'FFSS'.

16. The voltage conversion circuit as set forth in claim 14, wherein when the first voltage is lower than the second voltage and the input signal goes to high level from low level, the signal transmission stages of the first level-shifting unit operate in a transition delay characteristic of 'SSSF' and the signal transmission stages of the second level-shifting unit operate in a transition delay characteristic of 'SFFF'.

17. The voltage conversion circuit as set forth in claim 14, wherein when the first voltage is lower than the second voltage and the input signal goes to low level from high level, the signal transmission stages of the first level-shifting unit operate in a transition delay characteristic of 'SSFF' and the signal transmission stages of the second level-shifting, unit operate in a transition delay characteristic of 'SSFF'.

18. A voltage conversion circuit comprising:
an input terminal receiving an input signal of a first voltage;
an output terminal generating an output signal of a second voltage; and
first and second level-shifting units connected between the input and output terminals,
wherein the first and second level-shifting units have different transition delay characteristics from each other so that rising and falling transition delays of the output signal are varied in the same rate when the first and second voltages are changed,
wherein the first level-shifting unit comprises:
a first inverter connected to the input terminal;
a second inverter connected to the output of the first inverter;
a first differential amplifier having first and second cross-coupling nodes and operating in response to outputs of the first and second inverter; and
a first isolation circuit to electrically disconnect the output terminal from the first cross-coupling node and drive the output terminal with one of the second voltage and a ground voltage in response to outputs from the second cross-coupling node and the second inverter,
wherein the first and second inverters are supplied with the first voltage, and the first differential amplifier and isolation circuit are supplied with the second voltage.

19. The voltage conversion circuit as set forth in claim 18, wherein the second level-shifting unit comprises:
a third inverter connected to the input terminal;
a second differential amplifier having third and fourth cross-coupling nodes and generating a signal with one of the second voltage and the ground voltage in response to the input signal and an output of the third inverter;
a second isolation circuit generating a signal with one of the second voltage and the ground voltage in response to outputs from the fourth cross-coupling node and the third inverter; and
a fourth inverter connected between an output of the second isolation circuit and the output terminal,
wherein the third inverter is supplied with the first voltage, and the second differential amplifier, the second isolation circuit, and the fourth inverter are supplied with the second voltage.

20. The voltage conversion circuit as set forth in claim 19, wherein the first isolation circuit comprises:
a PMOS transistor connected between the second voltage and the output terminal, having a gate coupled to a second cross-coupling node of the first differential amplifier; and
a NMOS transistor connected between the output terminal and the ground voltage, having a gate coupled to the output of the second differential amplifier.

21. The voltage conversion circuit as set forth in claim 19, wherein the second isolation circuit comprises:
a PMOS transistor connected between the second voltage and an input of the fourth inverter, having a gate coupled to the fourth cross-coupling node of the second differential amplifier; and
a NMOS transistor connected between the input of the fourth inverter and the ground voltage, having a gate coupled to the output of the third inverter.

22. The voltage conversion circuit as set forth in claim 18, wherein the second level-shifting unit comprises:
a second differential amplifier having third and fourth cross-coupling nodes and generating a signal with one of the second voltage and the ground voltage in response to the output of the first inverter and the input signal;
a second isolation circuit generating a signal with one of the second voltage and the ground voltage in response to outputs from the fourth cross-coupling node and the first inverter; and
a fourth inverter connected between an output of the second isolation circuit and the output terminal,
wherein the second differential amplifier, the second isolation circuit, and the fourth inverter are supplied with the second voltage.

23. The voltage conversion circuit as set forth in claim 22, wherein the second isolation circuit comprises:

a PMOS transistor connected between the second voltage and an input of the fourth inverter, having a gate coupled to the fourth cross-coupling node of the second differential amplifier; and a NMOS transistor connected between the input of the fourth inverter and the ground voltage, having a gate coupled to the output of the first inverter.

24. The voltage conversion circuit as set forth in claim 18 wherein the first level-shifting unit further comprises a third inverter connected between an output of the first differential amplifier and the output terminal.

25. The voltage conversion circuit as set forth in claim 24 wherein the second level-shifting unit comprises:

- a second differential amplifier having third and fourth cross-coupling nodes and generating a signal with one of the second voltage and the ground voltage in response to the input signal and an output of the first inverter;
- a second isolation circuit generating a signal with one of the second voltage and the ground voltage in response to outputs from the fourth cross-coupling node and the first inverter; and
- a fourth inverter connected between an output of the second isolation circuit and the output terminal,
- wherein the second differential amplifier, the second isolation circuit, and the third inverter are supplied with the second voltage.

26. A voltage conversion circuit comprising:

an input terminal receiving an input signal of a first voltage;

an output terminal generating an output signal of a second voltage; and first and second level-shifting units connected between the input and output terminals, wherein the first and second level-shifting units have different transition delay characteristics from each other so that rising and falling transition delays of the output signal are varied in the same rate when the first and second voltages are changed, wherein the first level-shifting unit comprises:

a first inverter connected to the input terminal;

a second inverter connected to the output of the first inverter;

a first differential amplifier generating a signal with one of the second voltage and a ground voltage in response to the output of the first inverter and the output of the second inverter; and a third inverter connected between an output of the first differential amplifier and the output terminal, wherein the first inverter and second inverter are supplied with the first voltage, and the first differential amplifier and the third inverter are supplied with the second voltage.

27. The voltage conversion circuit as set forth in claim 26, wherein the second level-shifting unit comprises:

a fourth inverter connected to the input terminal;

a second differential amplifier generating a signal with one of the second voltage and a ground voltage in response to the input signal and an output of the fourth inverter; and a fifth inverter and a sixth inverter, the fifth inverter being connected to an output of the second differential amplifier and the sixth inverter being connected to the output of the fifth inverter and the output terminal, wherein the fourth inverter is supplied with the first voltage, and the second differential amplifier, the fifth inverter and the sixth inverter are supplied with the second voltage.

* * * * *